US012560651B2

(12) United States Patent
Takizawa et al.

(10) Patent No.: US 12,560,651 B2
(45) Date of Patent: Feb. 24, 2026

(54) SHORT-CIRCUIT DETECTION DEVICE FOR ROTATING ELECTRIC MACHINE, AND SHORT-CIRCUIT DETECTION METHOD

(71) Applicant: Mitsubishi Generator Co., Ltd., Hyogo (JP)

(72) Inventors: Yuji Takizawa, Tokyo (JP); Atsushi Yamamoto, Tokyo (JP); Susumu Maeda, Tokyo (JP); Nobuaki Muroki, Tokyo (JP)

(73) Assignee: MITSUBISHI GENERATOR CO., LTD., Hyogo (JP)

( * ) Notice: Subject to any disclaimer, the term of this patent is extended or adjusted under 35 U.S.C. 154(b) by 514 days.

(21) Appl. No.: 17/927,903

(22) PCT Filed: Jul. 8, 2020

(86) PCT No.: PCT/JP2020/026682
§ 371 (c)(1),
(2) Date: Nov. 28, 2022

(87) PCT Pub. No.: WO2022/009330
PCT Pub. Date: Jan. 13, 2022

(65) Prior Publication Data
US 2023/0204667 A1    Jun. 29, 2023

(51) Int. Cl.
*G01R 31/34*        (2020.01)
*G01R 31/52*        (2020.01)

(52) U.S. Cl.
CPC ........... *G01R 31/346* (2013.01); *G01R 31/52* (2020.01)

(58) Field of Classification Search
CPC .............................. G01R 31/346; G01R 31/52
See application file for complete search history.

(56) References Cited

U.S. PATENT DOCUMENTS 4,136,312 A      1/1979   Salon et al.
5,006,769 A *    4/1991   Posedel ................ G01R 31/343
                                                              361/33
(Continued)

FOREIGN PATENT DOCUMENTS

EP        0608442       *  8/1994   ............. G01R 31/06
JP        S5384101 A       7/1978
(Continued)

OTHER PUBLICATIONS

International Search Report and Written Opinion mailed on Sep. 24, 2020, received for PCT Application PCT/JP2020/026682, filed on Jul. 8, 2020, 8 pages including English Translation.

*Primary Examiner* — Lisa M Caputo
*Assistant Examiner* — Sharah Zaab
(74) *Attorney, Agent, or Firm* — XSENSUS LLP

(57)        ABSTRACT

A short-circuit detection device for a rotating electric machine sets an order lower than a fundamental order of a slot harmonic wave as a threshold value, and reduces, among the plurality of frequency components, even-order frequency components having orders higher than the threshold value and odd-order frequency components, converts a plurality of frequency components output from the specific frequency component reduction unit into a voltage signal, generates a difference waveform of voltage signals respectively corresponding to adjacent magnetic poles, detects a short-circuit of a field winding based on a shape of the difference waveform, and estimates a short-circuit position of the field winding, and determines an estimation accuracy of the short-circuit position of the field winding based on a degree of symmetry of a waveform of a maximum wave with respect to a peak angle of the difference waveform serving as a center.

8 Claims, 9 Drawing Sheets

(56) References Cited

U.S. PATENT DOCUMENTS

| | | | |
|---|---|---|---|
| 2002/0125788 A1* | 9/2002 | Leijon .................... | H02K 15/12 |
| | | | 310/400 |
| 2002/0144871 A1* | 10/2002 | Menjak ................. | F16D 57/002 |
| | | | 188/267 |
| 2009/0045765 A1* | 2/2009 | Ichiyama ............. | H02K 21/028 |
| | | | 318/538 |
| 2020/0228038 A1* | 7/2020 | Takahashi ................ | H02K 1/16 |
| 2022/0120822 A1 | 4/2022 | Takizawa et al. | |
| 2022/0146593 A1 | 5/2022 | Takizawa et al. | |

FOREIGN PATENT DOCUMENTS

| | | | |
|---|---|---|---|
| WO | 2020183610 A1 | 9/2020 | |
| WO | 2020208812 A1 | 10/2020 | |
| WO | 2021130987 A1 | 7/2021 | |

* cited by examiner

SHORT-CIRCUIT DETECTION DEVICE FOR ROTATING ELECTRIC MACHINE, AND SHORT-CIRCUIT DETECTION METHOD

CROSS-REFERENCE TO RELATED APPLICATION

The present application is based on PCT filing PCT/JP2020/026682, filed Jul. 8, 2020, the entire content of which is incorporated herein by reference.

TECHNICAL FIELD

This disclosure relates to a short-circuit detection device for a rotating electric machine and a short-circuit detection method for a rotating electric machine.

BACKGROUND ART

In a related-art rotating electric machine, a change in field flux caused by a short-circuit of a field winding of a rotor is detected by a search coil. The search coil is fixed to a stator in a gap between the rotor and the stator. When no short-circuit occurs in the field winding, only magnetic fluxes of odd-order frequency components are detected by the search coil. In contrast, when the short-circuit occurs in the field winding, in addition to the magnetic fluxes of the odd-order frequency components, magnetic fluxes of even-order frequency components are detected by the search coil (see, for example, Patent Literature 1).

CITATION LIST

Patent Literature

[PTL 1] JP 53-84101 A

SUMMARY OF INVENTION

Technical Problem

However, the related-art rotating electric machine has a problem in that it is difficult to estimate at which position of the rotor the field winding is short-circuited.

This disclosure has been made in order to solve the above-mentioned problem, and has an object to provide a short-circuit detection device for a rotating electric machine and a short-circuit detection method for a rotating electric machine which are capable of estimating at which position in a circumferential direction of a field system a short-circuit of a field winding has occurred.

Solution to Problem

According to one embodiment of this disclosure, there is provided a short-circuit detection device for a rotating electric machine, the short-circuit detection device including: a signal acquisition unit configured to acquire a voltage signal from a magnetic detector arranged opposed to a field winding provided in a plurality of slots of a field system; a signal decomposition unit configured to decompose the voltage signal acquired by the signal acquisition unit into a plurality of frequency components having orders different from each other; a specific frequency component reduction unit configured to set an order lower than a fundamental order of a slot harmonic wave being a harmonic wave having a correlation with a pitch of the plurality of slots as a threshold value, and to reduce, among the plurality of frequency components, an even-order frequency component having an order higher than the threshold value and an odd-order frequency component; a signal conversion unit configured to convert a plurality of frequency components output from the specific frequency component reduction unit into a voltage signal; a short-circuit detection unit configured to: divide the voltage signal converted by the signal conversion unit for each circumferential angle of the field system corresponding to one of a plurality of magnetic poles of the field system; generate a difference waveform of voltage signals respectively corresponding to adjacent magnetic poles among the plurality of magnetic poles; detect a short-circuit of the field winding based on a shape of the difference waveform; and estimate at which position in a circumferential direction of the field system the short-circuit of the field winding has occurred; and an estimation accuracy determination unit configured to determine an estimation accuracy of the position at which the short-circuit has occurred, wherein, when one wave including a maximum value of an absolute value of a peak voltage in the difference waveform is defined as a maximum wave, and a circumferential angle of the field system corresponding to the maximum value is defined as a peak angle, the estimation accuracy determination unit is configured to determine the estimation accuracy of the position at which the short-circuit has occurred based on a degree of symmetry of a waveform of the maximum wave with respect to the peak angle serving as a center.

According to one embodiment of this disclosure, there is provided a short-circuit detection method for a rotating electric machine, the short-circuit detection method including: a signal acquisition step of acquiring a voltage signal from a magnetic detector arranged opposed to a field winding provided in a plurality of slots of a field system; a signal decomposition step of decomposing the voltage signal acquired in the signal acquisition step into a plurality of frequency components having orders different from each other; a specific frequency component reduction step of setting an order lower than a fundamental order of a slot harmonic wave being a harmonic wave having a correlation with a pitch of the plurality of slots as a threshold value, and reducing, among the plurality of frequency components, an even-order frequency component having an order higher than the threshold value and an odd-order frequency component; a signal conversion step of converting a plurality of frequency components processed in the specific frequency component reduction step into a voltage signal; a short-circuit detection step of: dividing the voltage signal converted in the signal conversion step for each circumferential angle of the field system corresponding to one of a plurality of magnetic poles of the field system; generating a difference waveform of voltage signals respectively corresponding to adjacent magnetic poles among the plurality of magnetic poles; detecting a short-circuit of the field winding based on a shape of the difference waveform; and estimating at which position in a circumferential direction of the field system the short-circuit of the field winding has occurred; and an estimation accuracy determination step of determining an estimation accuracy of the position at which the short-circuit has occurred, wherein, when one wave including a maximum value of an absolute value of a peak voltage in the difference waveform is defined as a maximum wave, and a circumferential angle of the field system corresponding to the maximum value is defined as a peak angle, the estimation accuracy determination step includes determining the estimation accuracy of the position at which the short-circuit has occurred based on a degree of symmetry of a waveform of the maximum wave with respect to the peak angle serving as a center.

Advantageous Effects of Invention

According to the short-circuit detection device for a rotating electric machine and the short-circuit detection method for a rotating electric machine of this disclosure, it is possible to estimate at which position in the circumferential direction of the field system the short-circuit of the field winding has occurred.

DESCRIPTION OF EMBODIMENTS

Now, embodiments of this disclosure are described with reference to the drawings.

First Embodiment

Figure 1:
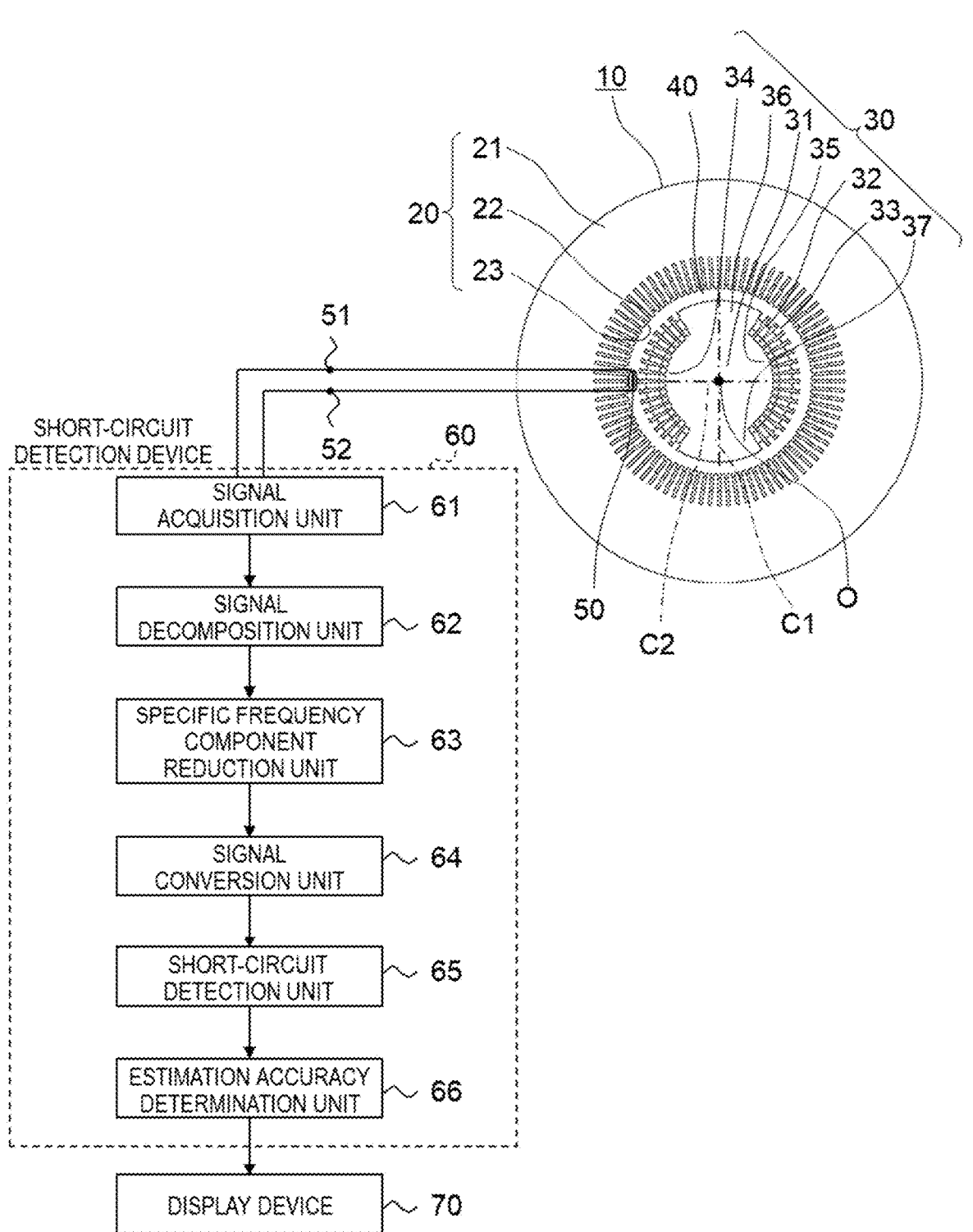
FIG. 1 is a configuration diagram for illustrating a rotating electric machine and a short-circuit detection device according to a first embodiment of this disclosure.

FIG. 1 is a configuration diagram for illustrating a rotating electric machine and a short-circuit detection device according to a first embodiment of this disclosure. In the first embodiment, a turbine generator 10 is adopted as the rotating electric machine. In FIG. 1, the turbine generator 10 is illustrated in a cross section perpendicular to an axial direction of the turbine generator 10.

As illustrated in FIG. 1, the turbine generator 10 includes a stator 20 serving as an armature and a rotor 30 serving as a field system. The stator 20 includes a cylindrical stator core 21 and multi-phase windings 22. The stator 20 is provided on the outer side of the rotor 30.

An axial direction of the stator core 21 is a direction along an axial center of the stator core 21, and is a direction perpendicular to the drawing sheet of FIG. 1. A radial direction of the stator core 21 is a radius direction of a circle having the axial center of the stator core 21 as a center. A circumferential direction of the stator core 21 is a direction along an arc having the axial center of the stator core 21 as a center.

A plurality of stator slots 23 are formed in an inner peripheral portion of the stator core 21. Each stator slot 23 is formed along the radial direction of the stator core 21. Further, the plurality of stator slots 23 are arranged at equal pitches in the circumferential direction of the stator core 21. In the first embodiment, the total number of stator slots 23 is 84. The multi-phase windings 22 are wound in the plurality of stator slots 23.

The rotor 30 includes a rotor core 31, a field winding 32, and a rotary shaft (not shown). The rotor core 31 and the rotary shaft are arranged coaxially with the stator core 21. The rotor 30 is rotatable about the rotary shaft.

An axial direction of the rotor core 31 is a direction along an axial center O of the rotor core 31, and is a direction perpendicular to the drawing sheet of FIG. 1. A radial direction of the rotor core 31 is a radius direction of a circle having the axial center O of the rotor core 31 as a center. A circumferential direction of the rotor core 31 is a direction along an arc having the axial center O of the rotor core 31 as a center.

A plurality of rotor slots 33 are formed in an outer peripheral portion of the rotor core 31. Each rotor slot 33 is formed along the radial direction of the rotor core 31.

In the first embodiment, the plurality of rotor slots 33 are divided into a first slot group 34 and a second slot group 35. Each of the first slot group 34 and the second slot group 35 includes 16 rotor slots 33. That is, the total number of rotor slots 33 is 32.

In each of the first slot group 34 and the second slot group 35, the plurality of rotor slots 33 are arranged at equal pitches in the circumferential direction of the rotor core 31. The pitch of the rotor slot 33 is a distance between width-direction centers of two rotor slots 33 adjacent to each other in the circumferential direction of the rotor core 31. The pitch of the rotor slots 33 in the first embodiment is 7.42° when the pitch is expressed by a circumferential angle of the rotor core 31. In the following, the pitch of the rotor slots 33 is referred to as "rotor slot pitch."

A first magnetic pole 36 and a second magnetic pole 37 are formed between the first slot group 34 and the second slot group 35. In FIG. 1, the dashed-and-dotted line passing through the axial center O of the rotor core 31, a center of the first magnetic pole 36 in the circumferential direction of the rotor 30, and a center of the second magnetic pole 37 in the circumferential direction of the rotor 30 is hereinafter referred to as "magnetic pole center line C1." The first slot group 34 and the second slot group 35 are arranged symmetric to each other with respect to the magnetic pole center line C1 serving as a center.

Further, the dashed-and-dotted line passing through the axial center O of the rotor core 31, a center of the first slot group 34 in the circumferential direction of the rotor core 31, and a center of the second slot group 35 in the circumferential direction of the rotor core 31 is hereinafter referred to as "inter-pole center line C2."

Each of the plurality of rotor slots 33 is referred to as "first slot," "second slot," . . . , or "eighth slot" in order from a side closer to the magnetic pole center line C1. In other words, each of the plurality of rotor slots 33 is referred to as "first slot," "second slot," . . . , or "eighth slot" in order from a side farther from the inter-pole center line C2.

In the plurality of rotor slots 33, the field winding 32 is wound so as to reciprocate between the first slot group 34 and the second slot group 35 across the magnetic pole center line C1. Parts of the field winding 32 that are arranged in adjacent rotor slots 33 are connected in series to each other.

The field winding 32 is DC-excited by an external power supply (not shown). In this manner, one of the first magnetic pole 36 or the second magnetic pole 37 becomes the N pole, and the other becomes the S pole. That is, the turbine generator 10 is a two-pole generator.

An air gap 40 is formed between the stator core 21 and the rotor core 31. The multi-phase windings 22 are AC-excited by an external power supply (not shown). In this manner, a rotating magnetic field is generated inside of the air gap 40.

A search coil 50 serving as a magnetic detector is fixed to the stator core 21. More specifically, the search coil 50 is fixed to a part of the inner peripheral portion of the stator core 21, which faces the air gap 40. Further, the search coil 50 is opposed to the field winding 32.

Main magnetic fluxes and leakage magnetic fluxes interlink with the search coil 50. The main magnetic flux is a magnetic flux generated in the air gap 40, and the leakage magnetic flux is a magnetic flux leaking out from each rotor slot 33. Magnetic fluxes interlinking with the search coil 50 are referred to as "interlinkage magnetic fluxes."

The search coil 50 includes a first terminal 51 and a second terminal 52. When magnetic fluxes interlink with the search coil 50, a voltage signal is induced between the first terminal 51 and the second terminal 52. A distribution of the interlinkage magnetic fluxes inside of the search coil 50 varies along with the rotation of the rotor 30.

A short-circuit detection device 60 includes, as functional blocks, a signal acquisition unit 61, a signal decomposition unit 62, a specific frequency component reduction unit 63, a signal conversion unit 64, a short-circuit detection unit 65, and an estimation accuracy determination unit 66.

The signal acquisition unit 61 acquires the voltage signal induced in the search coil 50. The signal decomposition unit 62 decomposes the voltage signal acquired by the signal acquisition unit 61 into a plurality of frequency components having orders different from each other. Further, the signal decomposition unit 62 separates each decomposed frequency component into an amplitude and a phase.

The specific frequency component reduction unit 63 sets an order of a frequency component lower than a fundamental order of a slot harmonic wave as a threshold value. The slot harmonic wave is a harmonic wave having a correlation with the rotor slot pitch.

Further, the specific frequency component reduction unit 63 reduces, among the separated amplitudes, even-order frequency components having orders higher than the threshold value and odd-order frequency components.

The signal conversion unit 64 integrates the phase and the amplitude obtained by the specific frequency component reduction unit 63 for each of all orders of the frequency components so as to convert the frequency components into a post-specific frequency component reduction voltage signal.

The short-circuit detection unit 65 divides the converted post-specific frequency component reduction voltage signal for each circumferential angle of the rotor 30 corresponding to one of the first magnetic pole 36 or the second magnetic pole 37 of the rotor 30. Further, the short-circuit detection unit 65 generates a difference waveform of voltage signals respectively corresponding to the first magnetic pole 36 and the second magnetic pole 37. Further, the short-circuit detection unit 65 detects a short-circuit of the field winding 32 based on a shape of the difference waveform, and also estimates at which position in the circumferential direction of the rotor 30 the short-circuit of the field winding 32 has occurred.

The estimation accuracy determination unit 66 determines an estimation accuracy of the position at which the short-circuit of the field winding 32 has occurred. Further, the estimation accuracy determination unit 66 outputs, to a display device 70, information on whether or not the short-circuit of the field winding 32 has occurred, the position of the rotor slot 33 in which the short-circuit has occurred, and the estimation accuracy of the rotor slot 33 in which the short-circuit has occurred.

The display device 70 is provided outside of the short-circuit detection device 60. The display device 70 displays, based on the information from the estimation accuracy determination unit 66, whether or not the short-circuit of the field winding 32 has occurred, the position of the rotor slot 33 in which the short-circuit has occurred, and the estimation accuracy of the rotor slot 33 in which the short-circuit has occurred.

Figure 2:
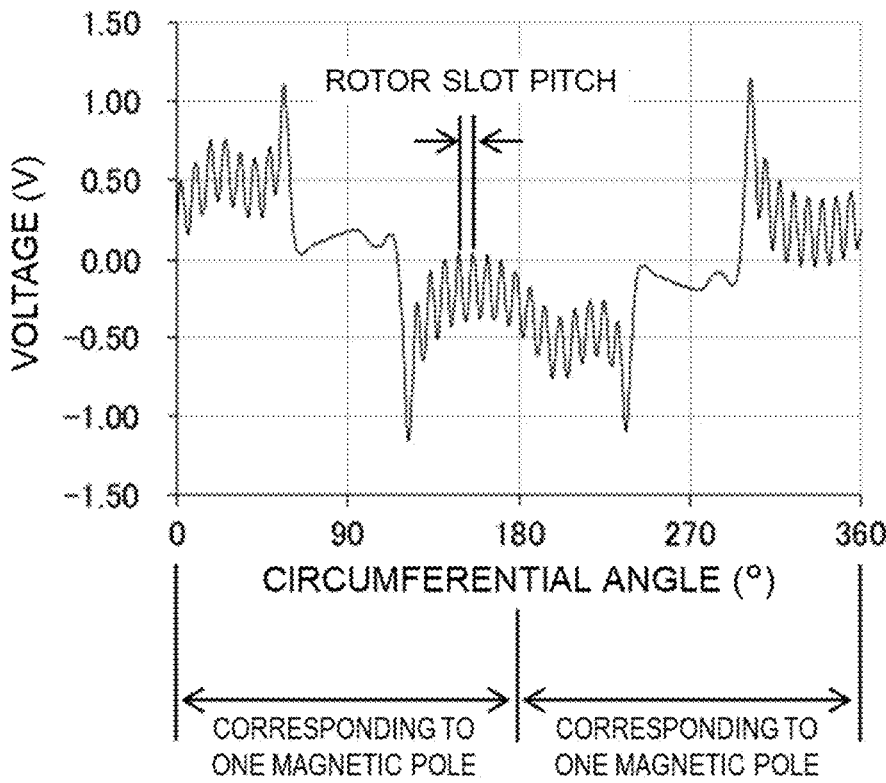
FIG. 2 is a waveform chart for illustrating an example of a voltage signal to be acquired by a signal acquisition unit of FIG. 1.

Next, the functional blocks of the short-circuit detection device 60 according to the first embodiment are described in more detail with reference to the drawings. FIG. 2 is a waveform chart for illustrating an example of the voltage signal to be acquired by the signal acquisition unit 61 of FIG. 1. This waveform chart is obtained by simulating a load operation state of the turbine generator 10 of FIG. 1 through use of an electromagnetic field analysis program. The simulation is executed under a condition in which, for example, the field winding 32 has a short-circuit of one turn in the second slot on the first magnetic pole 36 side.

As illustrated in FIG. 2, for example, circumferential angles of from 0° to 180° correspond to the first magnetic pole 36, and circumferential angles of from 180° to 360° correspond to the second magnetic pole 37. Accordingly, at the circumferential angle of 90°, the center of the first magnetic pole 36 comes closest to the search coil 50, and at the circumferential angle of 270°, the center of the second magnetic pole 37 comes closest to the search coil 50. The thirty-two fine voltage variations of FIG. 2 are caused at every rotor slot pitches, that is, 7.42°.

Figure 3:
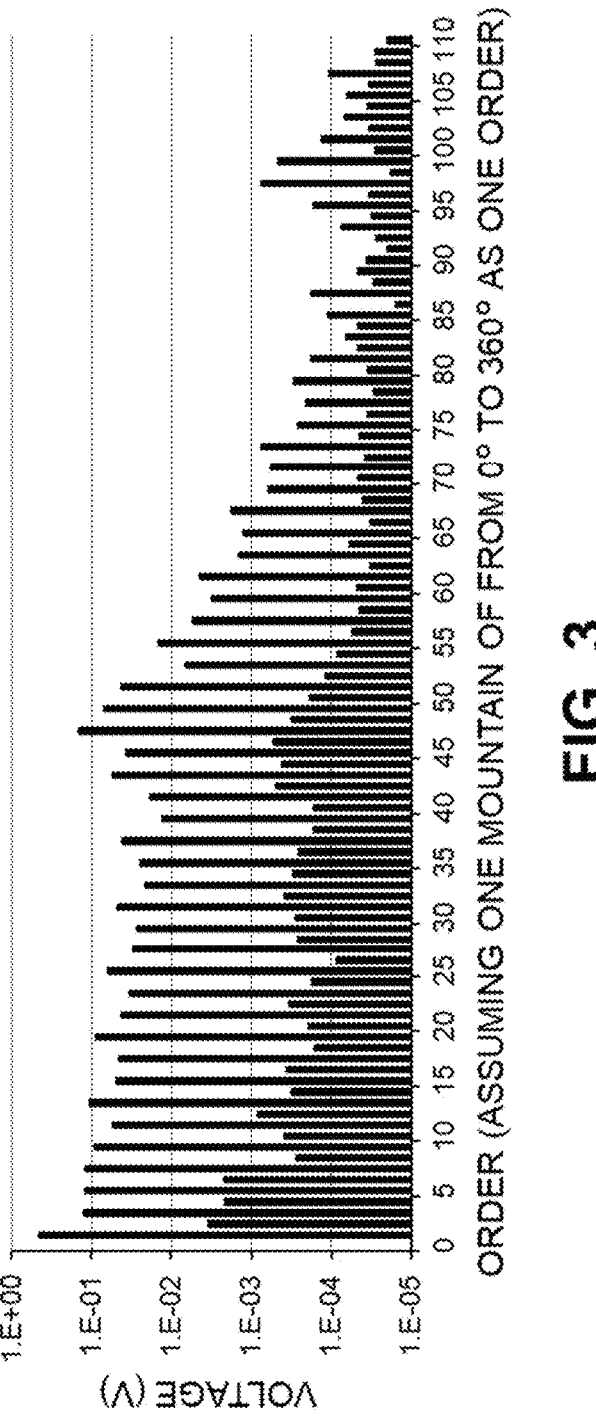
FIG. 3 is a spectral diagram for illustrating a frequency spectrum of amplitude components of the voltage signal subjected to frequency analysis by a signal decomposition unit of FIG. 1.

FIG. 3 is a spectral diagram for illustrating a frequency spectrum of amplitude components of the voltage signal subjected to frequency analysis by the signal decomposition unit 62 of FIG. 1. The horizontal axis represents an order of an n-th order harmonic wave, and FIG. 3 shows harmonic waves up to the 110th-order harmonic wave. Symbol "n" is an integer of 1 or more. Harmonic waves of the 111th order or more have small indication thereof is omitted. The amplitudes, and hence vertical axis represents a voltage intensity of the harmonic wave of each order.

It is understood from FIG. 3 that the voltage intensity of the odd-order harmonic wave is larger than the voltage intensity of the even-order harmonic wave. The odd-order harmonic wave is generated regardless of whether or not the short-circuit has occurred in the field winding 32. Meanwhile, the even-order harmonic wave is generated when the short-circuit has occurred in the field winding 32.

Further, among the odd-order harmonic waves, the 1st-order harmonic wave and the 47th-order harmonic wave have particularly large voltage intensities. The 1st-order harmonic wave is also referred to as "fundamental wave." The fundamental wave is a frequency component of the main magnetic flux. Further, the 47th-order harmonic wave is a slot harmonic wave. The slot harmonic wave is a harmonic wave having a correlation with the rotor slot pitch. The 47th order is the fundamental order of the slot harmonic wave. The slot harmonic wave is generated by a difference between a first-order magnetomotive force in the rotor 30 and a permeance change of the rotor slot pitch.

Harmonic waves of the 48th order or more are harmonic waves corresponding to pitches narrower than the rotor slot pitch, that is, angles smaller than the rotor slot pitch in the circumferential direction. A frequency component corresponding to an angle smaller than the rotor slot pitch is not a component required for estimating the short-circuit position of the field winding 32. In view of the above, the specific frequency component reduction unit 63 selects an order smaller than the 47th order as an order of the threshold value for removing the even-order frequency components. Then, the specific frequency component reduction unit 63 removes all of even-order frequency components having orders higher than the selected threshold value.

The voltage intensity of the slot harmonic wave is higher than the voltage intensity of the odd-order frequency component close to the slot harmonic wave. Accordingly, as the even-order frequency component has an order closer to the order of the slot harmonic wave, the even-order frequency component is more affected by the slot harmonic wave and is more liable to be unstable. Accordingly, it is more preferred that the threshold value be set so that the even-order frequency component susceptible to the slot harmonic wave is removed.

Further, the odd-order frequency component becomes a factor for inhibiting the detection of the even-order frequency component. Meanwhile, the odd-order frequency component includes information required for identifying the circumferential angle. Accordingly, it is not desired to completely remove the odd-order frequency components in order to estimate the short-circuit position of the field winding 32. In view of the above, the specific frequency component reduction unit 63 attenuates all of the odd-order frequency components without removing the odd-order frequency components.

More specifically, in the first embodiment, the specific frequency component reduction unit 63 sets the threshold value to 12, and removes even-order frequency components having orders equal to or higher than the 14th order. Further, the specific frequency component reduction unit 63 attenuates all of the odd-order frequency components to 1/50. As described above, in this embodiment, reduction of the frequency component includes removal of the frequency component and attenuation of the frequency component.

Figure 4:
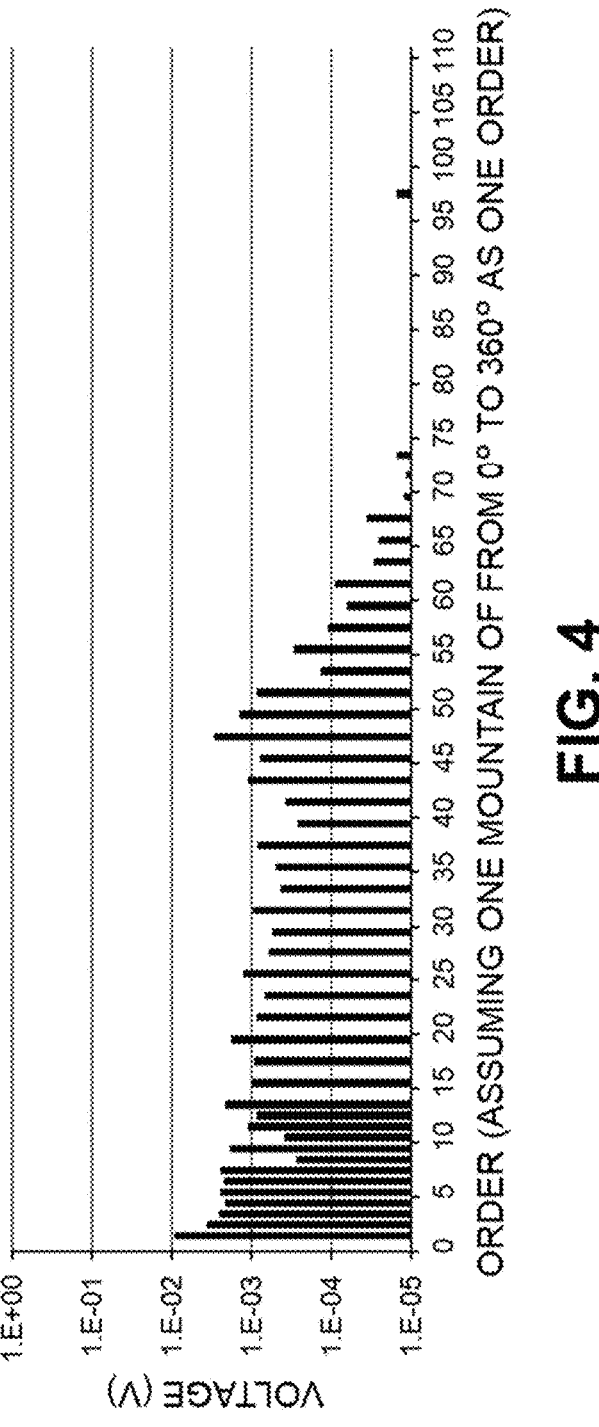
FIG. 4 is a spectral diagram for illustrating a frequency spectrum of amplitude components obtained after specific frequency components are reduced from the spectrum of FIG. 3 by a specific frequency component reduction unit of FIG. 1.

FIG. 4 is a spectral diagram for illustrating a frequency spectrum of amplitude components obtained after specific frequency components are reduced from the spectrum of FIG. 3 by the specific frequency component reduction unit 63 of FIG. 1. As illustrated in FIG. 4, the frequency spectrum of the amplitude components output from the specific frequency component reduction unit 63 includes even-order frequency components having 2nd to 12th orders and attenuated odd-order frequency components.

In this manner, the factor for inhibiting the detection of whether or not the short-circuit has occurred in the field winding 32 can be reduced. Thus, the detection accuracy of the short-circuit can be improved.

Figure 5:
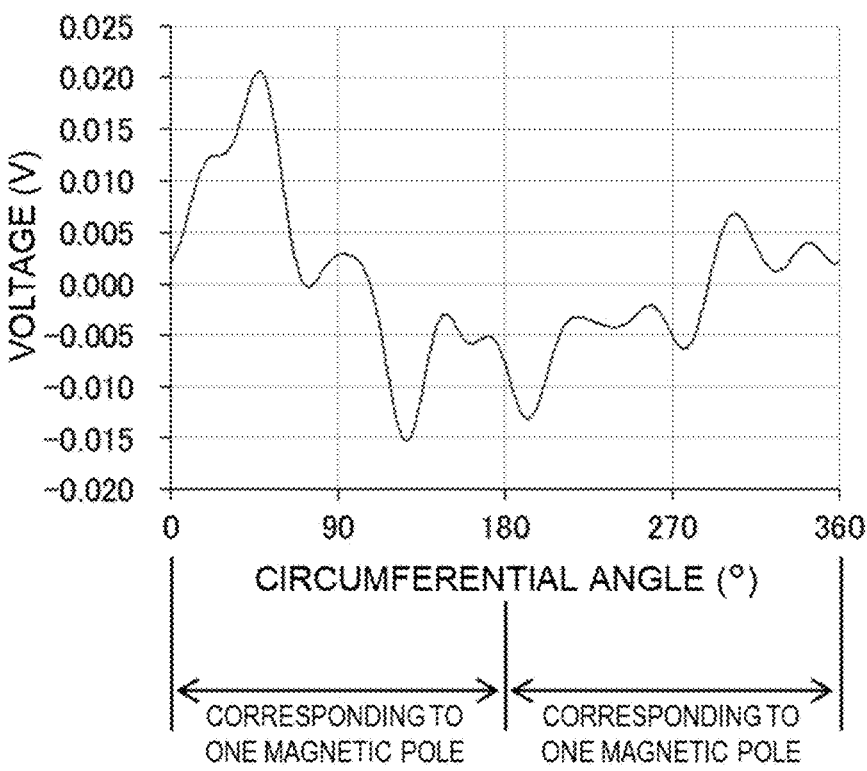
FIG. 5 is a chart for illustrating a voltage signal converted by a signal conversion unit of FIG. 1.

FIG. 5 is a chart for illustrating a voltage signal converted by the signal conversion unit 64 of FIG. 1. The converted voltage signal includes no component of the slot harmonic wave. Thus, as understood through comparison with FIG. 2, FIG. 5 has a long voltage variation period. In other words, a waveform having fine rotor slot pitches does not appear in FIG. 5.

Figure 6:
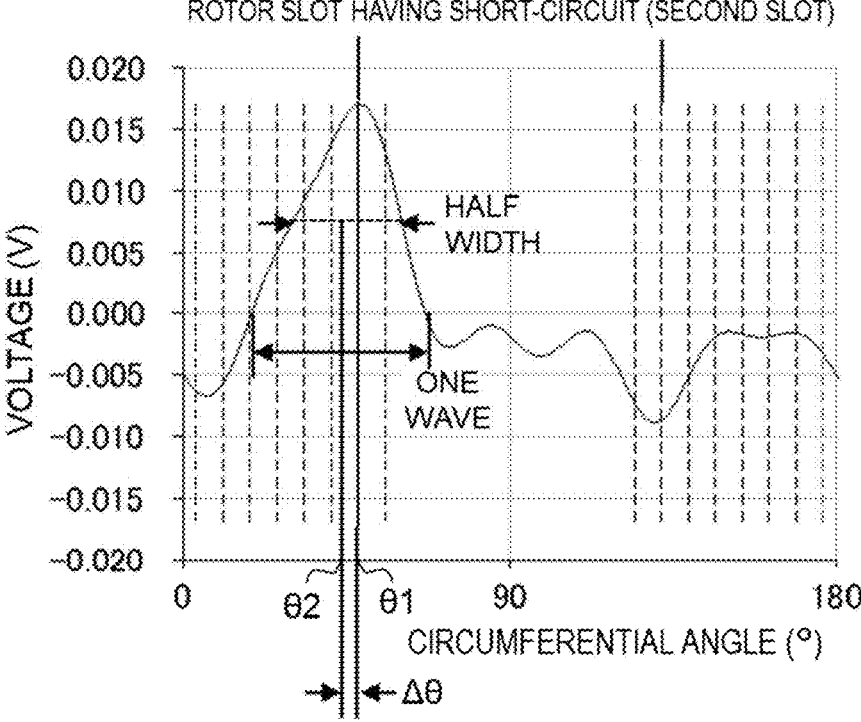
FIG. 6 is a chart for illustrating a difference waveform obtained by inputting the voltage signal illustrated in FIG. 5 to a short-circuit detection unit of FIG. 1.

FIG. 6 is a chart for illustrating a difference waveform obtained by inputting the voltage signal illustrated in FIG. 5 to the short-circuit detection unit 65 of FIG. 1. The first magnetic pole 36 and the second magnetic pole 37 have different polarities. Thus, in order to obtain the difference waveform, it is only required to add a waveform of from 0° to 180° corresponding to the first magnetic pole 36 and a waveform of from 180° to 360° corresponding to the second magnetic pole 37 to each other. The difference waveform illustrated in FIG. 6 is obtained by dividing the waveform illustrated in FIG. 5 into right and left sections and adding the sections to each other.

In the difference waveform of FIG. 6, a positive peak voltage appears at the position of 50°, and a negative peak voltage appears at the position of 130°. An absolute value of the positive peak voltage is larger than an absolute value of the negative peak voltage. Accordingly, the maximum value of the absolute value of the peak voltage in the difference waveform is the absolute value of the positive peak voltage. One wave including this maximum value is defined as "maximum wave."

The "one wave" refers to a range of: from a circumferential angle having the smallest absolute value of the voltage on one side of the peak voltage to a circumferential angle having the smallest absolute value of the voltage on the other side of the peak voltage.

The vertical broken lines of FIG. 6 represent circumferential angles of from the first slot to the eighth slot. The broken line closest to 90° corresponding to the center of the magnetic pole represents the first slot, and the broken line closest to 0° and 180° represents the eighth slot. An interval between the adjacent broken lines corresponds to the rotor slot pitch.

A half width of the one wave including the positive peak voltage and a half width of the one wave including the negative peak voltage are both larger than the rotor slot pitch. The half width is a circumferential angle range of one wave at a half voltage corresponding to a determination voltage. The half voltage is a voltage that is a half of the peak voltage.

As described above, appearance of a peak waveform wider than the rotor slot pitch indicates that the short-circuit has occurred in the field winding 32.

The peak voltage at 50° and the peak voltage at 130° are both closest to the broken lines representing the second slot. The short-circuit detection unit 65 estimates from this result that the short-circuit of the field winding 32 has occurred in the second slot.

The estimation accuracy determination unit 66 determines the estimation accuracy of the position at which the short-circuit has occurred, based on a degree of symmetry of the waveform of the maximum wave with respect to a peak angle $\theta 1$ serving as a center. The peak angle $\theta 1$ is a circumferential angle of the rotor 30 corresponding to the maximum value of the absolute value of the peak voltage.

The estimation accuracy determination unit 66 calculates a center angle θ2 of the maximum wave. The center angle θ2 is a circumferential angle corresponding to a center of the half width of the maximum wave.

With reference to FIG. 6, the center angle θ2 is 44°. The center angle θ2 is rather closer to the third slot than the second slot. An angle difference Δθ between the peak angle θ1 and the center angle θ2 is 6°, which is larger than ½ of 7.42° corresponding to the rotor slot pitch.

For example, when the maximum wave is bilaterally symmetrical with respect to the peak angle θ1, the peak angle θ1 and the center angle θ2 match each other. For example, when the maximum wave is laterally distorted and is not bilaterally symmetrical with respect to the peak angle θ1, or when the maximum wave locally has a great change in amplitude on any of right and left sides thereof, the peak angle θ1 and the center angle θ2 do not match each other.

As described above, the occurrence of the short-circuit of the field winding 32 can be detected based on the presence of the wide peak waveform. However, when the maximum wave is distorted, it is difficult to accurately estimate in which rotor slot 33 the short-circuit has occurred.

In view of the above, the estimation accuracy determination unit 66 determines the estimation accuracy based on the angle difference Δ0. In this manner, the certainty of the estimation accuracy of the short-circuit position of the field winding 32 can be quantitatively grasped, and erroneous estimation of the short-circuit position of the field winding 32 can be suppressed.

For example, when the angle difference 40 is sufficiently smaller than the rotor slot pitch, it can be estimated with high accuracy that the short-circuit has occurred in the rotor slot 33 corresponding to the peak angle θ1 and the center angle θ2. Meanwhile, for example, when the angle difference 40 is larger than ½ of the rotor slot pitch, it cannot be said that the rotor slot 33 corresponding to the peak angle θ1 matches the rotor slot 33 corresponding to the center angle θ2.

Figure 7:
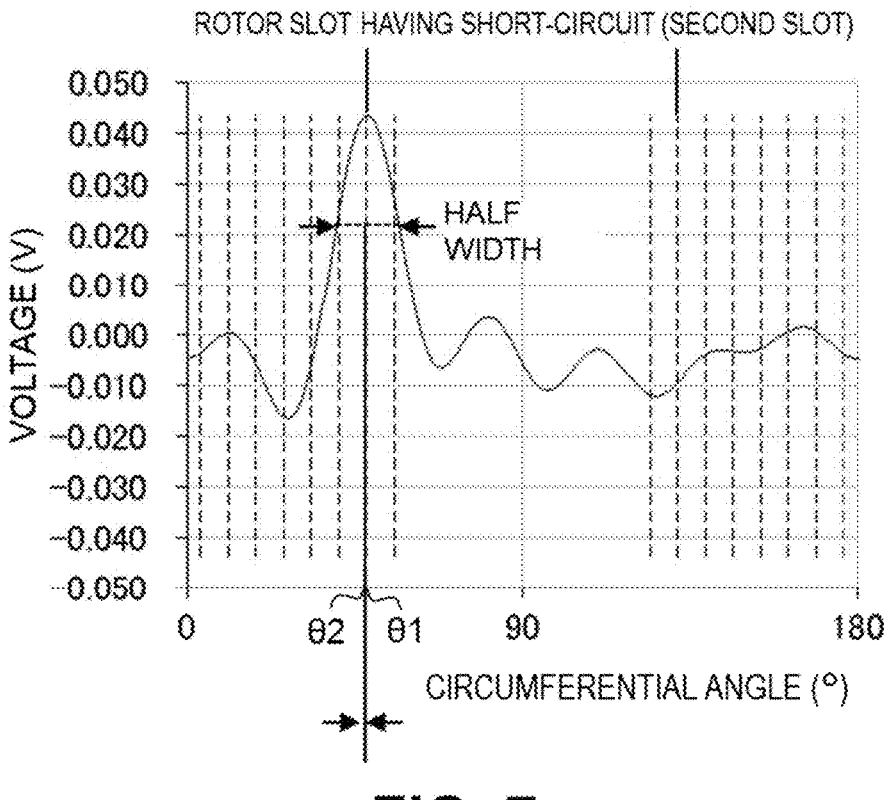
FIG. 7 is a chart for illustrating an example of a difference waveform obtained in an operation condition different from an operation condition of a turbine generator at the time when the difference waveform illustrated in FIG. 6 is obtained.

FIG. 7 is a chart for illustrating an example of a difference waveform obtained in an operation condition different from an operation condition of the turbine generator at the time when the difference waveform illustrated in FIG. 6 is obtained. In this operation condition, both of the peak angle θ1 and the center angle θ2 match the circumferential angle of the second slot. Accordingly, the angle difference 40 is zero.

As is understood from FIG. 6 and FIG. 7, the degree of symmetry of the waveform of the maximum wave of FIG. 7 is higher than the degree of symmetry of the waveform of the maximum wave of FIG. 6. As described above, as the angle difference 40 becomes closer to zero, the degree of symmetry of the waveform of the maximum wave becomes higher, and the estimation accuracy also becomes higher.

Figure 8:
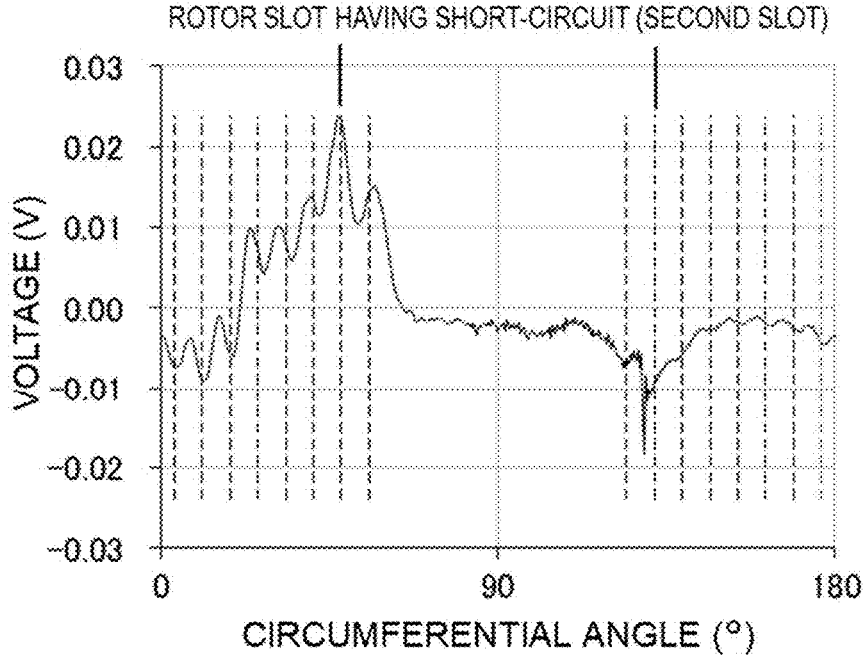
FIG. 8 is a chart for illustrating a difference waveform obtained when it is assumed that the voltage signal illustrated in FIG. 2 is directly input to the short-circuit detection unit of FIG. 1.

FIG. 8 is a chart for illustrating a difference waveform obtained when it is assumed that the voltage signal illustrated in FIG. 2 is directly input to the short-circuit detection unit 65 of FIG. 1. With reference to FIG. 8, a plurality of local one waves are present in addition to the one wave corresponding to the second slot. Accordingly, in this case, there is a fear in that it is erroneously estimated that the short-circuit of the field winding 32 has occurred also in the rotor slot 33 other than the second slot.

However, according to the short-circuit detection device 60 of the first embodiment, the even-order frequency components having orders equal to or higher than the threshold value are removed. Thus, the difference waveforms as illustrated in FIG. 6 and FIG. 7 are obtained. Accordingly, it is less likely to be erroneously estimated that the short-circuit of the field winding 32 has occurred in the rotor slot 33 other than the second slot.

Figure 9:
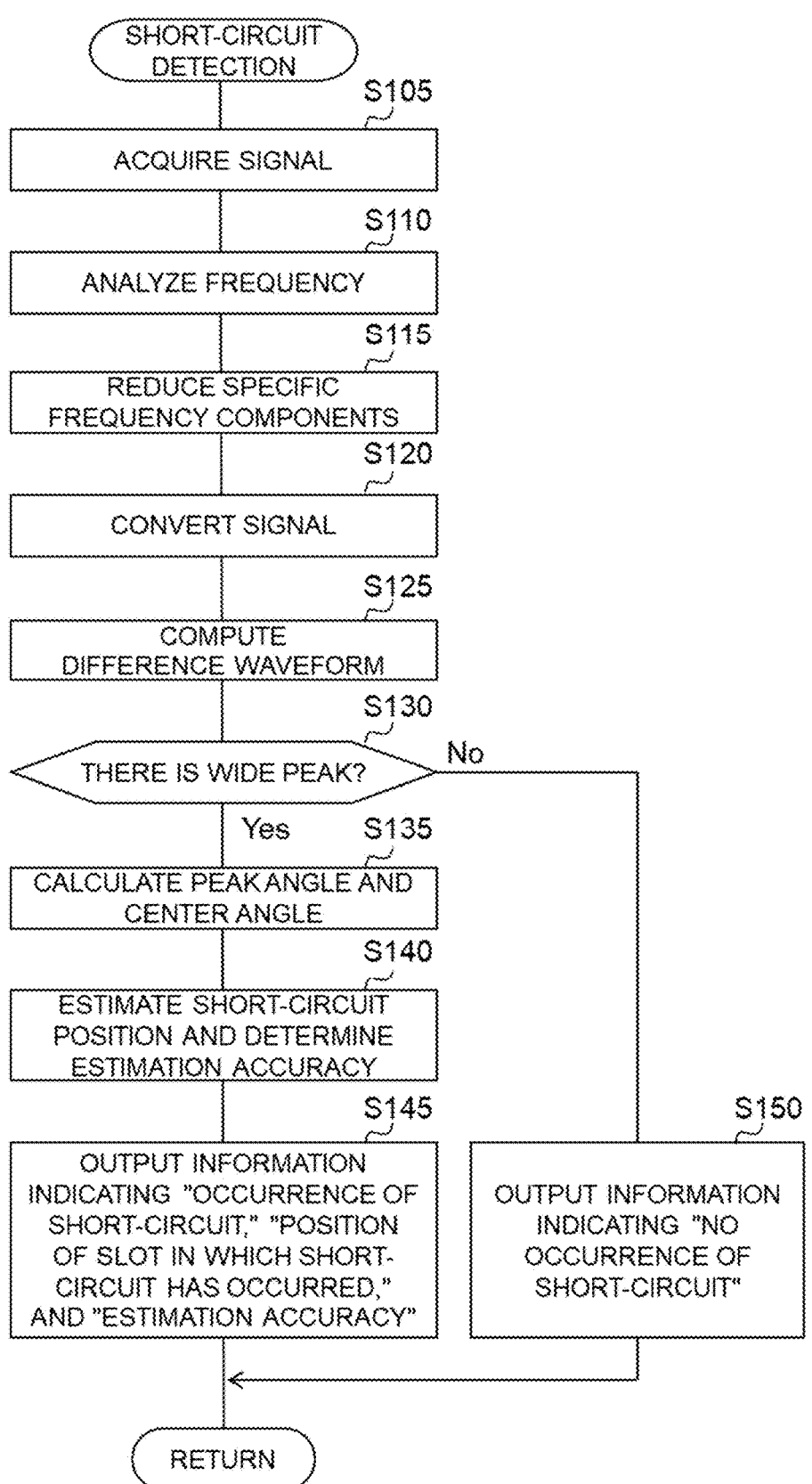
FIG. 9 is a flow chart for illustrating a short-circuit detection routine to be executed by the short-circuit detection device of FIG. 1.

FIG. 9 is a flow chart for illustrating a short-circuit detection routine to be executed by the functional blocks of the short-circuit detection device 60 of FIG. 1. For example, the routine of FIG. 9 is started when the short-circuit detection device 60 is activated, and is executed every time a certain time period elapses.

When the routine of FIG. 9 is started, first, in Step S105, the signal acquisition unit 61 acquires the voltage signal from the search coil 50. Then, in Step S110, the signal decomposition unit 62 performs frequency analysis for the amplitude and the phase of the acquired voltage signal.

Then, in Step S115, the specific frequency component reduction unit 63 performs frequency component reduction of the amplitudes subjected to frequency analysis. That is, the specific frequency component reduction unit 63 removes, among the amplitudes, even-order frequency components having orders higher than the threshold value, and also attenuates all of the odd-order frequency components to 1/50.

Then, in Step S120, the signal conversion unit 64 converts the phase and the amplitude processed by the specific frequency component reduction unit 63 into a voltage signal.

Then, in Step S125, the short-circuit detection unit 65 divides the converted voltage signal by an electrical angle corresponding to each magnetic pole, that is, by 180°, and compares voltage signals having adjacent electrical angles of 180°. In other words, the short-circuit detection unit 65 generates a difference waveform of adjacent electrical angles of 180°.

Then, in Step S130, the short-circuit detection unit 65 determines whether or not the generated difference waveform has a peak waveform wider than the rotor slot pitch. When there is no wide peak waveform, in Step S150, the short-circuit detection unit 65 outputs information indicating "no occurrence of short-circuit" to the display device 70, and this routine is temporarily ended.

In contrast, when the difference waveform has a wide peak waveform, in Step S135, the short-circuit detection unit 65 calculates the peak angle θ1 and the center angle θ2 of the wide peak waveform. Further, in Step S135, the short-circuit detection unit 65 estimates the short-circuit position of the field winding 32 based on the calculated peak angle θ1. The short-circuit position is represented by, for example, the name of the rotor slot 33 in which the short-circuit has occurred, such as the "second slot."

Then, in Step S140, the estimation accuracy determination unit 66 determines the estimation accuracy of the short-circuit position based on the calculated peak angle θ1 and center angle θ2.

Then, in Step S145, the estimation accuracy determination unit 66 outputs information indicating "occurrence of short-circuit," "short-circuit position," and "estimation accuracy of short-circuit position" to the display device 70, and this routine is temporarily ended.

As described above, a short-circuit detection method according to the first embodiment includes a signal acquisition step, a signal decomposition step, a specific frequency component reduction step, a signal conversion step, a short-circuit detection step, and an estimation accuracy determination step.

The signal acquisition step is a step of acquiring the voltage signal from the search coil 50 arranged opposed to the field winding 32. The signal decomposition step is a step of decomposing the voltage signal acquired in the signal acquisition step into a plurality of frequency components having orders different from each other.

The specific frequency component reduction step is a step of setting an order lower than the fundamental order of the slot harmonic wave as a threshold value and attenuating odd-order frequency components among the plurality of frequency components, and also removing even-order frequency components having orders higher than the threshold value. The signal conversion step is a step of converting the plurality of frequency components processed in the specific frequency component reduction step into a voltage signal.

The short-circuit detection step includes a step of dividing the voltage signal converted in the signal conversion step for each circumferential angle of the rotor 30 corresponding to one of the plurality of magnetic poles of the rotor 30, and generating a difference waveform of voltage signals respectively corresponding to adjacent magnetic poles among the plurality of magnetic poles. Further, the short-circuit detection step includes a step of detecting the short-circuit of the field winding based on the shape of the difference waveform, and estimating at which position in the circumferential direction of the rotor 30 the short-circuit of the field winding has occurred.

The estimation accuracy determination step is a step of determining the estimation accuracy of the position at which the short-circuit has occurred based on the degree of symmetry of the waveform of the maximum wave with respect to the peak angle θ1 serving as the center.

Further, a short-circuit detection program in the first embodiment is a program for causing a computer to execute the above-mentioned short-circuit detection method.

That is, the short-circuit detection program is a program for causing the computer to execute signal acquisition processing, signal decomposition processing, specific frequency component reduction processing, signal conversion processing, short-circuit detection processing, and estimation n accuracy determination processing.

The signal acquisition processing includes processing of acquiring the voltage signal from the search coil 50 arranged opposed to the field winding 32. The signal decomposition processing includes processing of decomposing the voltage signal acquired in the signal acquisition processing into a plurality of frequency components having orders different from each other.

The specific frequency component reduction processing includes processing of setting an order lower than the fundamental order of the slot harmonic wave as a threshold value and attenuating odd-order frequency components among the plurality of frequency components, and also removing even-order frequency components having orders higher than the threshold value. The signal conversion processing includes processing of converting the plurality of frequency components processed in the specific frequency component reduction processing into a voltage signal.

The short-circuit detection processing includes processing of dividing the voltage signal converted in the signal conversion step for each circumferential angle of the rotor 30 corresponding to one of the plurality of magnetic poles of the rotor 30, and generating a difference waveform of voltage signals respectively corresponding to adjacent magnetic poles among the plurality of magnetic poles. Further, the short-circuit detection processing includes processing of detecting the short-circuit of the field winding based on the shape of the difference waveform, and estimating at which position in the circumferential direction of the rotor 30 the short-circuit of the field winding has occurred.

The estimation accuracy determination processing includes processing of determining the estimation accuracy of the position at which the short-circuit has occurred based on the degree of symmetry of the waveform of the maximum wave with respect to the peak angle θ1 serving as the center.

As described above, according to the short-circuit detection device 60 and the short-circuit detection method of the first t embodiment, it is possible to estimate at which position in the circumferential direction of the rotor 30 the short-circuit of the field winding 32 has occurred. Further, the estimation accuracy of the short-circuit position of the field winding 32 can be determined.

Further, the estimation accuracy determination unit 66 calculates the center angle θ2 as the circumferential angle corresponding to the center of the half width of the maximum wave. In this manner, the degree of symmetry of the waveform of the maximum wave can be calculated easier.

Further, the specific frequency component reduction unit 63 estimates the fundamental order of the slot harmonic wave based on the amplitude of each frequency component. In this manner, in the frequency analysis, it is possible to save the user the trouble of designating the threshold value and the orders of the frequency components to be removed.

Further, the estimation accuracy determination unit 66 outputs to the display device 70 the information on whether or not the short-circuit of the field winding 32 has occurred, the position of the rotor slot 33 in which the short-circuit has occurred, and the estimation accuracy of the position of the rotor slot 33 in which the short-circuit has occurred. In this manner, the user can know whether or not the short-circuit of the field winding 32 has occurred, the position of the rotor slot 33 in which the short-circuit has occurred, and the estimation accuracy of the position of the rotor slot 33 in which the short-circuit has occurred.

Further, the short-circuit detection unit 65 detects the short-circuit of the field winding 32 based on the peak waveform appearing in the difference waveform, and estimates that the short-circuit of the field winding 32 has occurred in the rotor slot 33 corresponding to the peak angle θ1. In this manner, the short-circuit position of the field winding 32 can be estimated easier.

Second Embodiment

Next, a short-circuit detection device according to a second embodiment of this disclosure is described. In the first embodiment, the specific frequency component reduction unit 63 attenuates the amplitudes of all of the odd-order frequency components to 1/50. In contrast, in the second embodiment, the specific frequency component reduction unit 63 sets amplitudes of odd-order frequency components having orders equal to or lower than the threshold value to zero. In this manner, the frequency components having orders equal to or lower than the threshold value include only even-order frequency components. In this embodiment, the reduction of the frequency component includes setting the amplitude of the frequency component to zero.

The other configurations in the second embodiment are similar to those in the first embodiment.

When the even-order frequency component is considered as a signal component for detecting the short-circuit of the field winding 32, the odd-order frequency component is considered as a noise component. Accordingly, when the amplitudes of the odd-order frequency components having orders equal to or lower than the threshold value are set to zero, an SN ratio of the difference waveform can be improved, and the detection accuracy of whether or not the short-circuit has occurred can be improved.

However, in this case, the odd-order frequency components having orders equal to or lower than the threshold value are not included, and hence the angle in the circumferential direction of the first magnetic pole 36 and the second magnetic pole 37 cannot be accurately grasped. However, in some cases, the short-circuit position of the field winding 32 can be estimated from the angle difference between the circumferential angle of the positive peak voltage and the circumferential angle of the negative peak voltage.

As described above, in the short-circuit detection device 60 according to the second embodiment, the specific frequency component reduction unit 63 sets the amplitudes of the odd-order frequency components having orders equal to or lower than the threshold value to zero. In this manner, the occurrence of the short-circuit of the field winding 32 can be detected more accurately.

In the first and second embodiments, the fundamental order of the slot harmonic wave is estimated by the specific frequency component reduction unit 63. However, the fundamental order of the slot harmonic wave is identified by the number of magnetic poles, the arrangement of the rotor slots 33, and the like. Accordingly, the fundamental order of the slot harmonic wave and the threshold value may be stored in advance in the specific frequency component reduction unit 63.

Further, in the first and second embodiments, the determination voltage is not required to be the half voltage as long as the determination voltage has a value lower than the maximum value of the voltage of the maximum wave.

Further, in the first and second embodiments, the estimation accuracy determination unit 66 determines the estimation accuracy based on the angle difference 40 between the peak angle θ1 and the center angle θ2, but the determination method for the estimation accuracy is not particularly limited as long as the method is based on the degree of symmetry of the waveform of the maximum wave.

Figure 10:
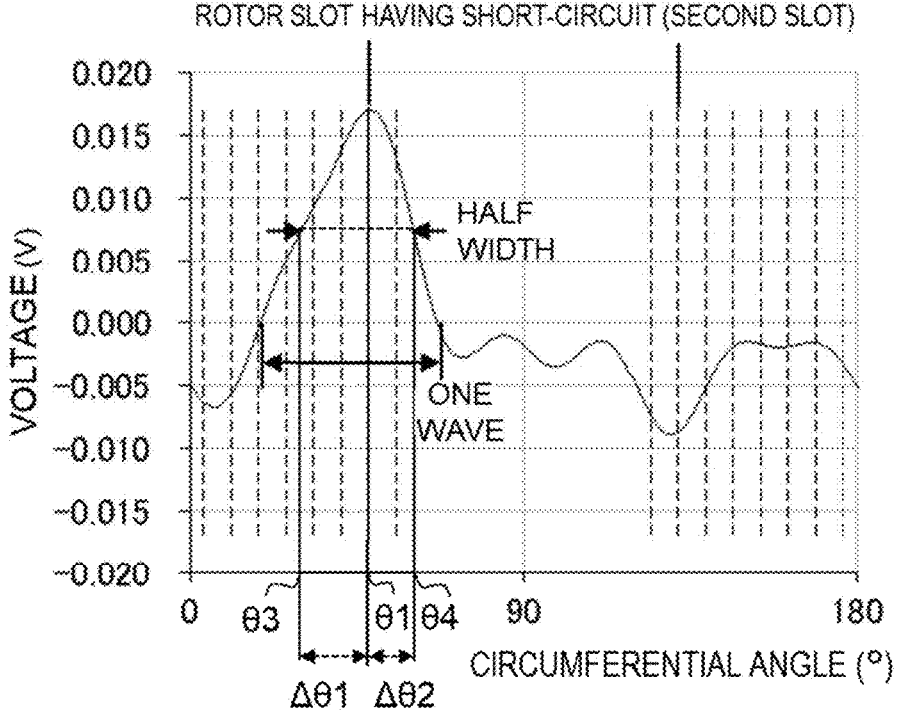
FIG. 10 is a chart for illustrating another determination method to be performed by an estimation accuracy determination unit of FIG. 1.

FIG. 10 is a chart for illustrating another determination method to be performed by the estimation accuracy determination unit 66 of FIG. 1. As illustrated in FIG. 10, for example, the estimation accuracy determination unit 66 may determine the estimation accuracy based on a difference between a first angle difference Δθ1 and a second angle difference Δθ2. The first angle difference Δθ1 is an angle difference between the peak angle θ1 and a circumferential angle θ3 corresponding to the determination voltage on one side of the maximum value. The second angle difference Δθ2 is an angle difference between the peak angle θ1 and a circumferential angle θ4 corresponding to the determination voltage on the other side of the maximum value.

In this case, it is determined that the estimation accuracy is higher as the difference between the first angle difference Δθ1 and the second angle difference Δθ2 is smaller.

In FIG. 10, the determination voltage is set as the half voltage, but the determination voltage is not limited to the half voltage.

Further, for example, the estimation accuracy may be determined based on a difference between a magnitude of a positive slope of the maximum wave at the determination voltage and a magnitude of a negative slope of the maximum wave at the determination voltage. The determination voltage may be the half voltage, or any voltage smaller than the maximum value. Also in this case, it is determined that the estimation accuracy is higher as the difference is smaller.

Further, in the first and second embodiments, when a determination threshold value of the estimation accuracy is set and the estimation accuracy obtained by the estimation accuracy determination unit 66 is lower than the determination threshold value, the operation condition of the turbine generator 10 may be changed, and the short-circuit detection routine of FIG. 9 may be executed again. In this manner, the short-circuit position of the field winding 32 is estimated under a state in which the estimation accuracy is higher.

Further, in the first and second embodiments, the number of stator slots 23, the number of rotor slots, the number of magnetic poles, and the rotor slot pitch are not limited to those in the above-mentioned example.

For example, when the number of magnetic poles is larger than two, it suffices that the short-circuit detection unit 65 generates the difference waveform as follows. The short-circuit detection unit 65 first divides the voltage signal converted by the signal conversion unit 64 for each circumferential angle of the rotor corresponding to one of the plurality of magnetic poles of the rotor. Further, it suffices that the short-circuit detection unit 65 generates the difference waveform of voltage signals respectively corresponding to adjacent magnetic poles among the plurality of magnetic poles.

Further, in the first and second embodiments, the rotor slot pitch is of only one type, but there may be a plurality of types of rotor slot pitches. When there are a plurality of types of rotor slot pitches, it suffices that the threshold value is set assuming an order of a voltage component having the largest rotor slot pitch, that is, among the plurality of slot harmonic waves, the slot harmonic wave having the smallest order as the fundamental order of the slot harmonic wave. In this manner, the frequency components corresponding to all of the rotor slot pitches can be removed.

Further, in the first and second embodiments, the specific frequency component reduction unit 63 is not always required to reduce all of the odd-order frequency components. That is, the specific frequency component reduction unit 63 may leave a part of the odd-order frequency components instead of reducing all of the odd-order frequency components within a range in which the even-order frequency components can be detected.

Further, in the first and second embodiments, the specific frequency component reduction unit 63 is not always required to remove the even-order frequency components having orders higher than the threshold value. That is, the specific frequency component reduction unit 63 may attenuate the even-order frequency components having orders higher than the threshold value within a range in which a peak waveform wider than the rotor slot pitch can be obtained in the difference waveform in the short-circuit detection unit 65.

Further, in the first and second embodiments, the signal decomposition unit 62 decomposes the voltage signal into a plurality of frequency components having orders different from each other, and further separates the plurality of frequency components into amplitudes and phases. Then, the specific frequency component reduction unit 63 performs processing of reducing specific frequency components for the amplitudes. However, the method of decomposing the signal is not particularly limited thereto.

For example, the signal decomposition unit 62 may decompose the voltage signal into a plurality of frequency components having orders different from each other, and the specific frequency component reduction unit 63 may perform processing of reducing specific frequency components for the plurality of decomposed frequency components. In this manner, the signal decomposition processing can be performed simpler.

Further, in the first and second embodiments, the rotor 30 is arranged on the inner peripheral side of the stator 20, but the rotor 30 may be arranged on the outer peripheral side of the stator 20.

Further, in the first and second embodiments, the turbine generator 10 is adopted as the rotating electric machine, but the rotating electric machine may be a generator other than the turbine generator 10, or may be a motor.

Figure 11:
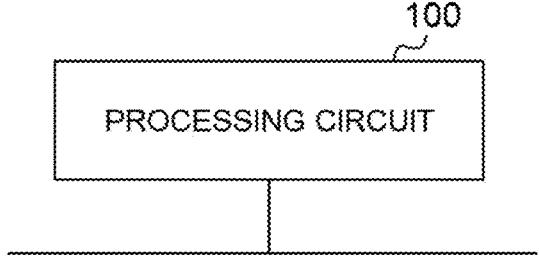
FIG. 11 is a configuration diagram for illustrating a first example of a processing circuit for implementing functions of a short-circuit detection device for a rotating electric machine according to each of the first embodiment and a second embodiment of this disclosure.

Further, the functions of the short-circuit detection device 60 according to each of the first and second embodiments are implemented by a processing circuit. FIG. 11 is a configuration diagram for illustrating a first example of the processing circuit for implementing the functions of the short-circuit detection device 60 according to each of the first and second embodiments. A processing circuit 100 of the first example is dedicated hardware.

Further, the processing circuit 100 corresponds to, for example, a single circuit, a complex circuit, a programmed processor, a processor for a parallel program, an application specific integrated circuit (ASIC), a field programmable gate array (FPGA), or a combination thereof.

Figure 12:
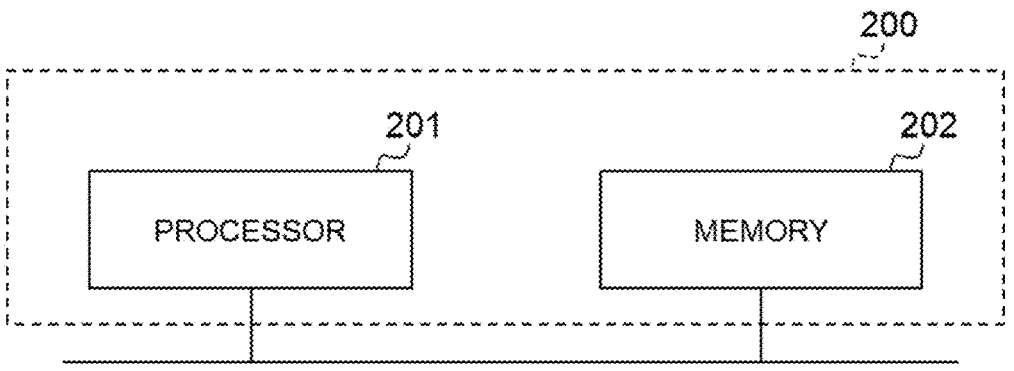
FIG. 12 is a configuration diagram for illustrating a second example of the processing circuit for implementing the functions of the short-circuit detection device for a rotating electric machine according to each of the first embodiment and the second embodiment.

Further, FIG. 12 is a configuration diagram for illustrating a second example of the processing circuit for implementing the functions of the short-circuit detection device 60 according to each of the first and second embodiments. A processing circuit 200 of the second example includes a processor 201 and a memory 202.

In the processing circuit 200, the functions of the short-circuit detection device 60 are implemented by software, firmware, or a combination of software and firmware. The software and the firmware are described as programs to be stored in the memory 202. The processor 201 reads out and executes the programs stored in the memory 202, to thereby implement the respective functions.

The programs stored in the memory 202 can also be regarded as programs for causing a computer to execute the procedure or method of each of the above-mentioned units. In this case, the memory 202 corresponds to, for example, a nonvolatile or volatile semiconductor memory, such as a random access memory (RAM), a read only memory (ROM), a flash memory, an erasable programmable read only memory (EPROM), or an electrically erasable and programmable read only memory (EEPROM). Further, a magnetic disk, a flexible disk, an optical disc, a compact disc, a mini disc, a DVD, or the like also corresponds to the memory 202.

The functions of the above-mentioned short-circuit detection device 60 may be implemented partially by dedicated hardware, and partially by software or firmware.

In this way, the processing circuit can implement the functions of the above-mentioned short-circuit detection device 60 by hardware, software, firmware, or a combination thereof.

REFERENCE SIGNS LIST

10 turbine generator (rotating electric machine), 20 stator (armature), 21 stator core, 22 multi-phase windings, 23 stator slot, 30 rotor (field system), 31 rotor core, 32 field winding, 33 rotor slot (slot), 36 first magnetic pole, 37 second magnetic pole, 40 air gap, 50 search coil (magnetic detector), 60 short-circuit detection device, 61 signal acquisition unit, 62 signal decomposition unit, 63 specific frequency component reduction unit, 64 signal conversion unit, 65 short-circuit detection unit, 66 estimation accuracy determination unit

The invention claimed is:

1. A short-circuit detection device for a rotating electric machine, the short-circuit detection device comprising:
circuitry configured to:
as a process:
acquire a first voltage signal from a magnetic detector arranged opposed to a field winding provided in a plurality of slots of the rotating electric machine;
decompose the first voltage signal into a plurality of frequency components having orders different from each other;
set an order lower than a fundamental order of a slot harmonic wave being a harmonic wave having a correlation with a pitch of the plurality of slots as a threshold value;
reduce, among the plurality of frequency components, an even-order frequency component having an order higher than the threshold value and an odd-order frequency component;
convert the plurality of frequency components into a second voltage signal;
divide the second voltage signal into a divided voltage signal for each circumferential angle of the rotating electric machine corresponding to one of a plurality of magnetic poles of the rotating electric machine;
generate a difference waveform of voltage signals of the divided voltage signals respectively corresponding to adjacent magnetic poles among the plurality of magnetic poles;
detect a short-circuit of the field winding based on a shape of the difference waveform;
estimate at which position in a circumferential direction of the rotating electric machine the short-circuit of the field winding has occurred; and
determine an estimation accuracy of the position at which the short-circuit has occurred,
determine whether the estimation accuracy estimated in the process is lower than a determination threshold value, and
when the estimation accuracy estimated in the process is lower than a determination threshold value:
change an operation condition of the rotating electric machine; and
perform the process again after the change of the operation condition,
wherein, when one wave including a maximum value of an absolute value of a peak voltage in the difference waveform is defined as a maximum wave and a circumferential angle of the rotating electric machine corresponding to the maximum value is defined as a peak angle, the circuitry is configured to determine the estimation accuracy of the position at which the short-circuit has occurred based on a degree of symmetry of a waveform of the maximum wave with respect to the peak angle serving as a center.

2. The short-circuit detection device for a rotating electric machine according to claim 1, wherein the circuitry is configured to determine the estimation accuracy based on an angle difference between the peak angle and a center angle being a circumferential angle corresponding to a center of a width of the maximum wave at a determination voltage being a voltage smaller than the maximum value of the maximum wave.

3. The short-circuit detection device for a rotating electric machine according to claim 2, wherein the determination voltage is a voltage that is a half of the maximum value.

4. The short-circuit detection device for a rotating electric machine according to claim 1, wherein the circuitry is configured to estimate the fundamental order of the slot harmonic wave based on an amplitude of each of the plurality of frequency components.

5. The short-circuit detection device for a rotating electric machine according to claim 1, wherein the circuitry is configured to set an amplitude of an odd-order frequency component having an order equal to or lower than the threshold value to zero.

6. The short-circuit detection device for a rotating electric machine according to claim 1, wherein the circuitry is configured to output, to an outside, information on whether the short-circuit of the field winding has occurred, a position of a corresponding one of the plurality of slots in which the short-circuit has occurred, and the estimation accuracy of the position of the corresponding one of the plurality of slots in which the short-circuit has occurred.

7. The short-circuit detection device for a rotating electric machine according to claim 1, wherein the circuitry is configured to detect the short-circuit of the field winding based on a peak waveform appearing in the difference waveform, and to estimate that the short-circuit of the field winding has occurred in a slot corresponding to the peak angle.

8. A short-circuit detection method for a rotating electric machine, the short-circuit detection method comprising:

as a process:

acquiring a first voltage signal from a magnetic detector arranged opposed to a field winding provided in a plurality of slots of a field system;

decomposing the first voltage signal into a plurality of frequency components having orders different from each other;

setting an order lower than a fundamental order of a slot harmonic wave being a harmonic wave having a correlation with a pitch of the plurality of slots as a threshold value;

reducing, among the plurality of frequency components, an even-order frequency component having an order higher than the threshold value and an odd-order frequency component;

converting the plurality of frequency components into a second voltage signal;

dividing the second voltage signal into a divided voltage signal for each circumferential angle of the field system corresponding to one of a plurality of magnetic poles of the field system;

generating a difference waveform of voltage signals of the divided voltage signals respectively corresponding to adjacent magnetic poles among the plurality of magnetic poles;

detecting a short-circuit of the field winding based on a shape of the difference waveform;

estimating at which position in a circumferential direction of the field system the short-circuit of the field winding has occurred; and determining an estimation accuracy of the position at which the short-circuit has occurred, determining whether the estimation accuracy estimated in the process is lower than a determination threshold value, and when the estimation accuracy estimated in the process is lower than the determination threshold value:

changing an operation condition of the rotating electric machine; and performing the process again after the changing of the operation condition, wherein, when one wave including a maximum value of an absolute value of a peak voltage in the difference waveform is defined as a maximum wave and a circumferential angle of the field system corresponding to the maximum value is defined as a peak angle, the determining includes determining the estimation accuracy of the position at which the short-circuit has occurred based on a degree of symmetry of a waveform of the maximum wave with respect to the peak angle serving as a center.

* * * * *